(12) United States Patent
Klusza et al.

(10) Patent No.: US 8,989,440 B2
(45) Date of Patent: Mar. 24, 2015

(54) SYSTEM AND METHOD OF ROOM DECORATION FOR USE WITH A MOBILE DEVICE

(71) Applicants: Mark Klusza, Houston, TX (US); James M. Janky, Los Altos, CA (US)

(72) Inventors: Mark Klusza, Houston, TX (US); James M. Janky, Los Altos, CA (US)

(73) Assignee: Way Out IP, LLC, Los Altos, CA (US)

( * ) Notice: Subject to any disclaimer, the term of this patent is extended or adjusted under 35 U.S.C. 154(b) by 147 days.

(21) Appl. No.: 13/837,938

(22) Filed: Mar. 15, 2013

(65) Prior Publication Data

US 2013/0259308 A1     Oct. 3, 2013

Related U.S. Application Data

(60) Provisional application No. 61/616,155, filed on Mar. 27, 2012.

(51) Int. Cl.
 *G06K 9/00* (2006.01)
 *G06T 19/00* (2011.01)
 *G09B 25/00* (2006.01)

(52) U.S. Cl.
 CPC .......... *G06K 9/00624* (2013.01); *G06T 19/00* (2013.01); *G06T 2210/04* (2013.01)
 USPC ............................. 382/103; 382/286; 434/80

(58) Field of Classification Search
 USPC ......... 382/100, 103, 106, 113, 154, 155, 162, 382/168, 173, 181, 190, 199, 203, 206, 209, 382/214, 232, 254, 274, 276, 285–291, 305, 382/312; 434/72, 80; 715/782; 705/26.5, 705/14; 345/419; 703/1
 See application file for complete search history.

(56) References Cited

U.S. PATENT DOCUMENTS 7,523,411 B2 *  4/2009  Carlin ........................... 715/782
 2002/0032546 A1 *  3/2002  Imamura et al. .................. 703/1
 (Continued)

FOREIGN PATENT DOCUMENTS

| EP | 88503 A2 | 9/1983 |
|---|---|---|
| WO | 2006054992 A1 | 5/2006 |
| WO | 2009010058 A1 | 1/2009 |

OTHER PUBLICATIONS

PCT/DK2008/000260, International Application Serial No. PCT/DK2008/000260, Search Report and Written Opinion mailed Dec. 3, 2008, Young/Fehn Development A/S, 11 Pages.

*Primary Examiner* — Seyed Azarian
(74) *Attorney, Agent, or Firm* — GTC Law Group LLP & Affiliates

(57) ABSTRACT

The present disclosure includes systems and computer-implemented methods for redesigning rooms in a house using digital image analysis. The analysis includes defining room parameters based on the architectural shape of the room as determined from an analysis of the walls, ceiling, windows, and doors, performing a room size calibration and defining an empty 3D room. Using the analyzed digital image, redesign can progress with selecting types of inner surfaces of the room from a pre-defined collection of architectural shapes, selecting types of furniture in the room, and selecting types of lighting. Then, a 3D model of the redesigned room is generated wherein the architectural shape is in the form of 2D and wherein the 2D image has an associated 3D image. At least one image of the redesigned 3D room may be generated and stored, and may be transmitted to a receiver wherein the corresponding showroom picture is displayed.

20 Claims, 10 Drawing Sheets

(56) References Cited

U.S. PATENT DOCUMENTS

| | | |
|---|---|---|
| 2004/0161727 A1 | 8/2004 | Brodine |
| 2005/0283345 A1 | 12/2005 | Trabona |
| 2006/0263133 A1 | 11/2006 | Engle et al. |
| 2008/0103908 A1* | 5/2008 | Munk .............................. 705/14 |
| 2012/0231424 A1* | 9/2012 | Calman et al. .................. 434/72 |
| 2012/0320033 A1* | 12/2012 | Papaefstathiou et al. ...... 345/419 |
| 2013/0073420 A1* | 3/2013 | Kumm et al. ................ 705/26.5 |

* cited by examiner

| | |
|---|---|
| 310 | Receive digital image |
| 320 | Receive User Preferences |
| 330 | Analyze digital image to determine room 'essence' [eigenvalues] |
| 340 | Perform comparison to stored layout models |
| 350 | Determine best layout model |
| 360 | Populate Layout model with sample objects based on user preferences |
| 370 | Publish (transmit) layout model digital image to user, along with list and URLs of manufacturers of suitable furnishing objects, and showrooms |

Fig. 3

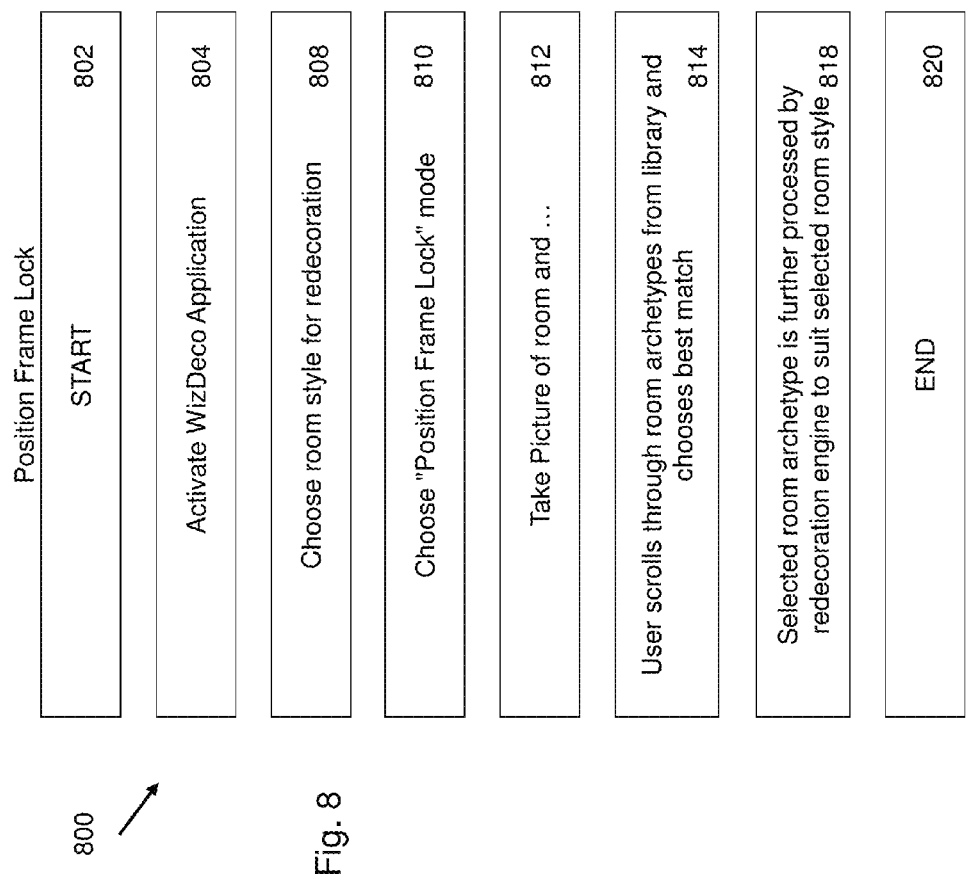

SYSTEM AND METHOD OF ROOM DECORATION FOR USE WITH A MOBILE DEVICE

CROSS-REFERENCE TO RELATED APPLICATIONS

This application claims the benefit of the following provisional applications, each of which is hereby incorporated by reference in its entirety:

U.S. Provisional Patent Application 61/616,155, filed Mar. 27, 2012.

This application is related to the following international patent application, which is incorporated by reference herein in its entirety: WO2009010058, published on 22 Jan. 2009.

BACKGROUND

1. Field

The present disclosure generally relates to a method for redesign of at least one room in a house, utilizing technology that transforms photos, and specifically interior photos into redecorated showroom images displayed on a portable person digital assistant or mobile device.

2. Description of the Related Art

Imagining how a room might look if decorated differently is a hard task for most people. It generally involves going to a furniture showroom to see what is available, and then trying to imagine how such furniture might look in the customer's chosen room.

The systems known in the prior art utilize computer-based imaging tools to aid a user in seeing what might be possible and feasible in a particular setting on a desktop computer.

Therefore, in light of the above discussion, there is a need for a method and system to do the same redecoration sampling and display it on a portable personal digital assistant or mobile device.

SUMMARY

The various embodiments of the present disclosure provides a unique web-based marketing service method and system for technology that transforms interior photos/digital imagery into redecorated three-dimensional (3D) magazine quality showroom images, displaying sample furniture items for user viewing on a handheld device.

In embodiments, the present disclosure includes a server configured to accept digital images/photos from property portals, mobile devices, and images found on the web, which may be then analyzed automatically, using specialized object recognition algorithms in software. The images may be parsed into essential elements, and classified according to room types. The user provides style preferences, allowable price ranges, and region where located, to help focus the user on furniture and showrooms easily available in his locale.

In embodiments, the present disclosure allows users to make use of their mobile device equipped with a digital camera, to take a photo of the room the user would like to envision what and how a redecoration might look. The user selects the room type, favorite style of decoration, and perhaps a specific furniture manufacturer, in a menu display created by the special application designed to run on the mobile device.

In embodiments, the present disclosure provides the digital image to be wirelessly transferred to a remote server for processing. The processing results in a bare room as described by a layout model, which may be then populated with furniture in appropriate locations in the room. The model layout of the original room, sans extant furniture but now including new furniture, may be returned to the user's mobile device for viewing.

In embodiments, the present disclosure provides a large variety of furniture items from furniture manufacturer's websites to be made available to the user on the user's mobile device, providing far more options than can be found in any single showroom.

In embodiments, the present disclosure provides users the ability to initiate the redecoration process via a wireless camera connection, or by giving a copy of the room photograph to a salesman, who can input the photograph into the redecoration website, and obtain a fast revision of what the room might look like under a variety of decorating decisions.

In embodiments, the present disclosure provides for collaboration with real estate portals, with the server system converting existing photos of living rooms into 3D interactive showrooms containing different furniture brands. Each piece of furniture may be linked to the manufacturers' own websites.

In embodiments, a method for real-time redesign of at least one room in a structure includes receiving at least one digital image of the room from a mobile device, performing an analysis of the digital image, generating a 3D model of the best match room type, populating the 3D model with at least one decoration, and generating an image of the populated 3D model. Analyzing the image includes defining room parameters based on at least one of the walls, ceiling, windows, floor, and doors, performing a room size calibration, defining a representative room based on the analysis and the calibration, and comparing the representative room to a collection of stored room types to identify a best match room type. The decoration involves selecting at least one type of furniture for the best match room from a data storage or selecting at least one type of lighting for the best match room from a data storage. The image of the populated 3D model may be generated from substantially the same point of view as the digital image. Any original interior decoration in the digital image may be rendered so as to provide a phantom-look room. The method may further include using a user preference to select the decoration, which may relate to at least one of a cost, a room type, a style of décor, a lighting type, an inner surface type, a floor type, a furniture type, a window type, a color, a furnishing, a texture, and a manufacturer. The room size is calibrated based on at least one known item shown in the digital image.

In an embodiment, a method for creating a visual representation of a redecorated room may include receiving a first image of the room, wherein the image is obtained from a digital camera associated with a mobile device having wireless communications capability, providing a menu of user preferences made available on the mobile device, and providing a server operating a program configured to access a database of reference rooms, receive said first image from the mobile device, and receive one or more user preferences. The program may be further configured to determine the shape and type of room, wherein said shape and type of room is used to select a layout model, select a reference layout model from the database of reference rooms, based on a match with the layout model, generate a visual representation of a redecorated room based on at least one user preference selected by the user from the menu of user preferences, and publish the visual representation to the mobile device for viewing by the user. The method may further include providing a set of URL's the user can select to view an object of interest from the visual representation. The digital image may be obtained wirelessly.

In an embodiment, an application for use on a mobile device may include a computer program configured for storage in a memory of a mobile device configured to present at least one preference to a user of the mobile device regarding the desired configuration of a room, send an image of a room to a server via a wireless transmission, send a user-selected preference choice to a server, receive and display an image of said room with a list of options for choices of decoration, select at least one optional decoration choice and send said choice to server and receive a modified image with said decoration choice shown in said image. The application may further include configuring the computer program to present at least one URL for access to the manufacturer website of said decoration choice.

In an embodiment, a system for creating a visual representation of a redecorated room may include a server having a processor, memory, and a connection to wireless services and the internet, a computer readable storage medium having encoded thereon a set of instructions executable by the processor to perform a series of operations including receiving at least one digital image of the room from a mobile device, performing an analysis of the digital image, generating a 3D model of the best match room type, populating the 3D model with at least one decoration, and generating an image of the populated 3D model. Performing the analysis may include defining room parameters based on at least one of the walls, ceiling, windows, floor, and doors, performing a room size calibration, defining a representative room based on the analysis and the calibration, and comparing the representative room to a collection of stored room types to identify a best match room type. Defining room parameters includes extracting one or more room eigenvalues from the image. The system further includes calculating a degree of match between stored room eigenvalues for a reference room and the extracted eigenvalues to identify the best match room type. The room eigenvalue is at least one of the location, direction and length of edges, corners, windows, doors, openings, walls, architectural shapes, and surfaces in the room. The decoration involves selecting at least one of a type of furniture and a type of lighting for the best match room from a data storage. Any original interior decoration in the digital image is rendered so as to provide a phantom-look room.

These and other systems, methods, objects, features, and advantages of the present disclosure will be apparent to those skilled in the art from the following detailed description of the preferred embodiment and the drawings.

All documents mentioned herein are hereby incorporated in their entirety by reference. References to items in the singular should be understood to include items in the plural, and vice versa, unless explicitly stated otherwise or clear from the text. Grammatical conjunctions are intended to express any and all disjunctive and conjunctive combinations of conjoined clauses, sentences, words, and the like, unless otherwise stated or clear from the context.

BRIEF DESCRIPTION OF THE FIGURES

The invention and the following detailed description of certain embodiments thereof may be understood by reference to the following figures:

FIG. 3 illustrates a flow chart depicting the steps in performing the method at a server.
FIG. 4 illustrates a flow chart depicting the steps in performing the method at a mobile device, in accordance with an embodiment of the present disclosure.
FIG. 8 illustrates a flow chart for the Position/Frame Lock Application.

DETAILED DESCRIPTION

Figure 1:
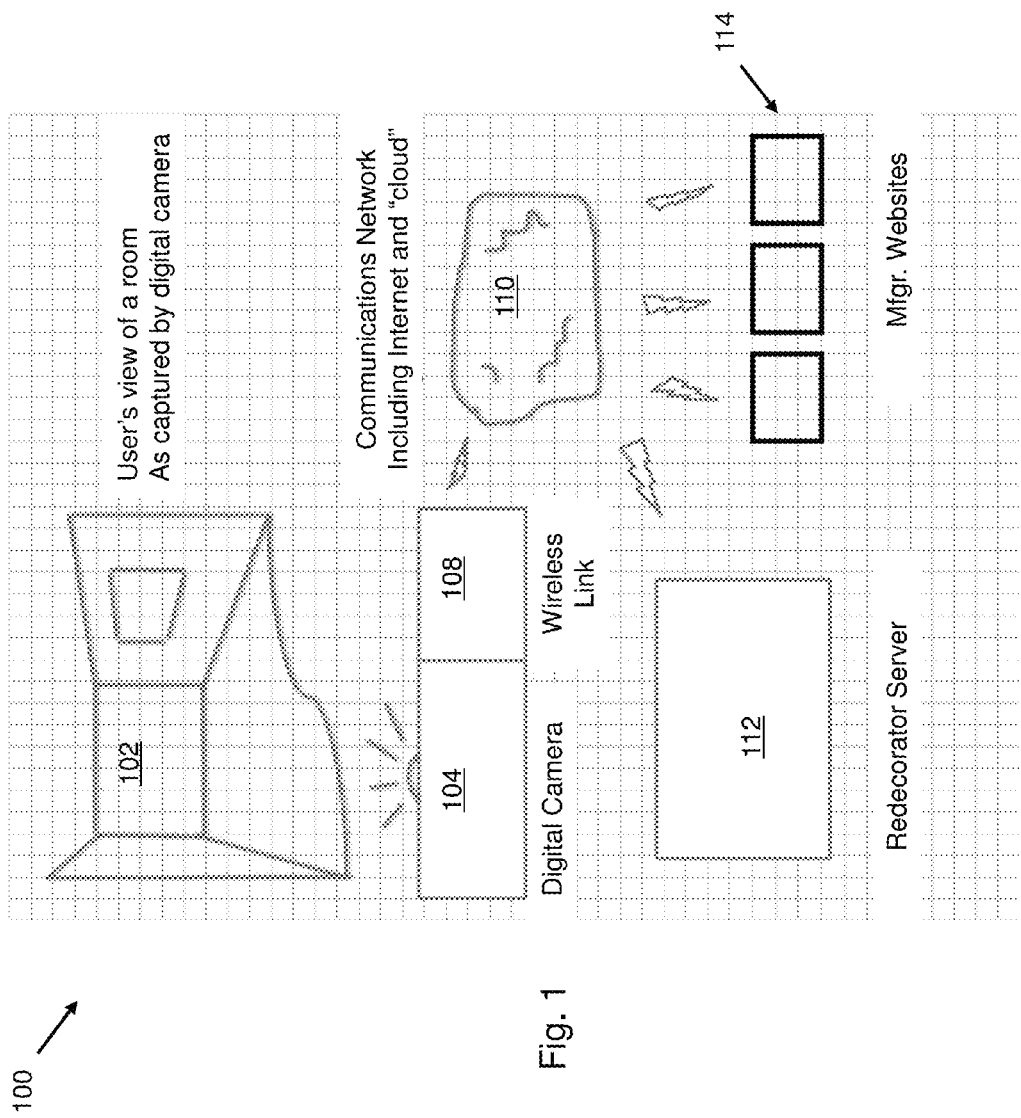
FIG. 1 illustrates the components that comprise the system.

The present disclosure includes systems and computer-implemented methods for redesigning a room or a model of a room in a structure using digital image analysis. In embodiments, the model may be an undecorated room. The analysis includes defining room parameters based on the architectural shape of the room as determined from an analysis of the walls, ceiling, windows, and doors, performing a room size calibration and defining an empty room, either in two or three dimensions. Using the analyzed digital image, redesign can progress with selecting a type of inner surfaces of the room from a pre-defined collection of architectural shapes, selecting a type of furniture for the room, and selecting a type of lighting. Then, a 3D model of the redesigned room may be generated wherein the architectural shape may be in the form of 2D and wherein the 2D image has an associated 3D image. At least one image of the redesigned 3D room may be generated and stored, and may be transmitted to a receiver wherein the corresponding showroom picture is displayed.

In an embodiment, a user activates the position/frame lock application on their mobile device or other computer system and chooses the room style the user would like the room to be redecorated into. The user then chooses the "Position Frame Lock" mode and takes a picture of the room with a camera, wherein the camera may be integral to the mobile device or not. The digital image, taken by the mobile device camera or otherwise uploaded to the application, may be wirelessly transferred to a remote server for processing. The user then scrolls through room archetypes from a library and chooses the best match for the redecoration style. The processing results in a bare room, which may be then filled with images of new furniture in the redecoration style chosen by the user. The model layout of the original room with the new furniture is returned to the user's mobile device.

In an embodiment, the position/frame lock application is a software application that may execute on a mobile device, including a mobile device with a camera, such as the iPhone, Android, Blackberry, or the like. The software may be also configured for operation on a desktop computer or a gaming device. This application helps the user find a "best fit" position in the room of interest, so that the image captured has a similar perspective to that of the stored reference rooms in the server database. The user may be instructed to move around the room of interest, and the application may analyze the room by comparing stored room archetype frame elements with the same kind of elements the program extracts from the current room view, as captured in an image. Each time the user moves, a new image may be captured and room eigenvalues may be extracted, wherein the location and direction and length of edges, windows, doors, and the like form the room eigenvalues. These eigenvalues may be 3D lines in space, as captured on a 2D flat surface, and direction/length may be estimated.

Room eigenvalues may be fundamental characteristics of a room. For example, a room eigenvalue may be the number of windows, doorways, and doors; the dimensions for windows and doors; the length of each wall; the height of each wall; room boundaries such as the intersection of a wall and a ceiling, or a wall and the floor; the existence of built-in features in the room, such as a recess in a wall for placing an object such as a telephone, a statue, or the like; the location of heating vents on the floor or on a wall, and the like. The application is configured to seek and recognize such 'room eigenvalues,' and to characterize their size and dimensions either by scaling from other recognized objects with known dimensions, or by comparison with stored models of similar objects.

There is a preset "degree of match" that may be used to decide when the user is in a good position in the room to provide a substantial match to the stored room eigenvalues for a reference room. An algorithm may be used to compare the calculated eigenvalues for the room in the digital image with eigenvalues for reference room types in order to identify a best match room type. When this percent degree of match is met, an alert may be given to the user, such as an audible beep or a visual cue (an icon, or a word displayed on the screen). The better the match to the same room perspective in the stored reference room, the more likely the user will be receptive to the decorations provided by the automatic redecoration process.

In an embodiment, the object recognition process may use recognition based on the architectural shape of a room. The architectural shape may include the layout of walls, ceiling, windows and doors. The original image may be processed to enhance the architectural shape and subdue interior decoration such as sofas, chairs, tables, lamps, pictures, etc. The architectural shape from the photo may be compared to a pre-defined collection of architectural shapes. The corresponding showroom picture is displayed.

In an embodiment, to enhance the architectural shape, the object recognition may use a graphical method to identify the long straight lines in the photo. The long lines include the corners and edges of walls, ceiling, doors and windows. The corners between ceiling and walls may be particularly enhanced since the ceiling shape gives a good indication of the room layout.

In an embodiment, comparing architectural shapes from images to a collection of architectural shapes, the long lines described above that originally consist of numerous image pixels may be converted into vectors, as these require much less computing power or processing.

In an embodiment, the position of the camera may be determined through the collection of pre-defined architectural shapes in the form of 2D images. Each architectural shape can have multiple 2D images that represent different positions of the camera. The benefit from having multiple images representing different camera positions is that the user will receive a redecorated picture very close to the original image.

In an embodiment, the coordinates may be determined through the architectural shapes that may be in the form of 2D images that contain only 2D information. Each architectural shape can, however, have an associated 3D computer model. This allows for usage such as 3D flythroughs, using e.g. the mobile device moving through the redecorated room.

In an embodiment, for the room type identification, the mobile device/PC user may decide which room type to decorate, which may be seen as added value since the user can select to re-define rooms, such as making the living room into a bedroom or vice versa. For example, applying the position/frame lock application for property portals require that the system identify whether the room is a living room, dining room, bedroom, bathroom or kitchen. The process would be to identify items such as tile patterns or sinks in bathrooms, benches or cupboards in kitchens, beds or nightstands in bedrooms, dining tables and chairs in dining rooms. The object recognition system can also group rooms or items in rooms according to already processed images and learn from prior iterations of object recognition.

In an embodiment, a digital image of an existing room may be used to create a sample mode, which may then be compared to a model layout. That model layout may then be used to display a 3D rendered picture of the original room, redecorated. The redecorated room may be for inspiration, showing the closest match of the image to the manufacturers' digital showrooms.

In an embodiment, the following components may be included: image capture, user preferences, server application, rendering process, and URL overlay.

In an embodiment, the image capture component may include images of existing rooms being captured using a mobile device with the photo transmitted to the server based object recognition system or using a computer with the selected photos transmitted to the server based object recognition system.

In an embodiment, the user preferences component consists of the user on a mobile device or computer being prompted to select what the user prefers the room to become, e.g. living room, bedroom, and dining room, what style of décor they wish to use for re-decoration, what manufacturer of furniture they wish to use, and the like. The System may check the Server application for what is available and download manufacturers and style selections; available styles, e.g. Modern, Classical, Art Deco, etc. with the user preferences transmitted to the Server Application together with the image.

In an embodiment, the server application component may include an element of image and preference retrieval. Image and preference retrieval entails the server application running continuously, awaiting images and associated preferences. Received information may be stored and passed on to the Object Recognition component of the server application. Object recognition involves image processing, room layout identification, and architectural shape (layout) identification. Image processing may consist of processing received images to enhance the layout (architectural shape) of the room. Existing furniture may be subdued or ignored, and the ceiling may be enhanced since its appearance may generally determine the layout. Room layout identification consists of doors, windows, corners, and edges stored in a model that is termed the "layout model", which consists of vectors that take up much less memory than the original graphic room photo, allowing very fast processing. The Layout Model may be stored with the original room photo and user preferences. Architectural shape (layout) identification consists of a pre-determined number of 2D Architectural images added to the system before receiving any user photos, these may be rendered images of each showroom that will be used, only rendered without any furniture. These empty room images may be used to create Layout Models just as for photos received from users. From analyzing typical room pictures the architectural layout can be classified into relatively standard types, for example, an initial collection of about twenty (20) with variations of door and window locations matches a large percentage of existing rooms. An important next step may be to run tests on a larger number of photo samples to verify the percentage match. The Matching process' purpose is to match the received photos with best fitting Architectural Shape image. The process may be performed by matching the Layout Models from the photo with best fitting layout Model from the collection of Architectural Shapes. The server application component also contains a publication process. As the best fitting Layout Model is identified, the corresponding showroom may be published from the Server Application back to the mobile device or computer. The showroom may be published as an image file with an overlay containing URLs that allows the user to click on an individual piece of furniture, read product info and be directed to a web address. The server application component may also contain a management interface. The management interface enables adding/managing Architectural shapes, i.e. empty showroom images, Furnished Showroom images, and URL overlays.

In an embodiment, the rendering process component may utilize a collection of showrooms containing variations of architectural types and position of doors and windows. The collection can easily be expanded to account for additional types. The rendering process may be as follows: the interior designers define a furniture set, containing e.g. sofa, chairs, tables, lamps, wallpaper, paint colors, etc., one set will be designed for each line of furniture from a manufacturer. The furniture set may be copied into each showroom, slightly adjusted for size and position versus windows and doors. Multiple rendered pictures may then be produced of each showroom, taken from different angles and with different focal lengths. The camera positions may be predefined, allowing a batch processing of the rendered images. Rendered images of empty showrooms may only need to be performed once because the images may only be used for the room layout matching process.

In an embodiment, the URL overlay will be produced for each rendered image. This may be a rendered outline of the furniture in the picture with URLs from each piece. The process may involve some manual work.

In an embodiment, the Model Layout used for display of the newly furnished sample furniture may be a representation based on a comparison of the original room image and a separate model layout, and as such is an original work not subject to copyright by the owner of any specific image of a room view designated for redecoration by an embodiment.

After a 3D model of the room to be re-decorated is rendered, the computer may automatically re-decorate the room, optionally according to a user preference. The re-decoration process involves populating the 3D model with furniture, colors, textures, flooring, wall and ceiling types, windows, doors, lighting, furnishings, and the like. An image of the populated 3D model may be generated for display to the user on the mobile device. The image may be generated from the same point of view as the original image of the room to be re-decorated.

In embodiments, display of the image of the populated 3D model may be done via an augmented reality interface of the mobile device. For example, the user may currently image the room using a mobile device camera and the image of populated 3D model may be overlaid with the current view of the room. As the user changes the position of the camera, the corresponding portion of the populated 3D model image is overlaid.

In an embodiment, the database storage system may keep a copy of all model layouts configured according to each user's decorating criteria. Information concerning the items displayed, the costs, the general location where the room is situated, and the like may be stored for future re-use by the initiating user. Each room redecoration event may be stored and marked with its own unique URL, for subsequent revisiting by the initiating user. The imagery may be available for use by the user in a variety of other activities, including posting to social networks, sharing with other users, and the like.

In an embodiment, once the image of a sample room may be cleared of its owner's decorations and redecorated according to the chosen style, and with any specific instructions, additional user viewing enhancements may be included and activated by the user. For example, an icon or pointer may be included in the new view of the redecorated room, which when selected by the user, activates a close-up view of a selected region of the picture, such as a particular item of furniture. Alternatively, a second or third set of decorations may be selected and displayed via any of a number of visual transition methods, commonly known as 'morphings.' Finally, information on the various items of furniture and decorative elements may be displayed for the user's benefit.

In an embodiment, the method for redesign of at least one room in a structure includes receiving and storing at least one digital image of the room in a computer system. The computer system may perform an analysis of the digital image by defining room parameters based on the architectural shape of the room as determined from an analysis of the layout of the walls, ceiling, windows, and doors, performing a room size calibration, defining an empty room wherein the original interior decoration may be rendered so as to provide a phantom-look room, selecting types of inner surfaces of the room in a data storage wherein an architectural shape from the photo may be compared to a pre-defined collection of architectural shapes and the best fitting architectural shape from the collection may be identified, selecting types of furniture in the room in a data storage wherein an architectural shape from the collection has one or more pre-produced, corresponding showroom pictures, selecting types of lighting in a data storage, generating a 3D model of the redesigned room wherein the architectural shape may be in the form of 2D and wherein the 2D image has an associated 3D image, generating and storing at least one image of the redesigned 3D room, and transmitting at least one image to one or more receivers wherein the corresponding showroom picture may be displayed. In some embodiments, the 2D image may be converted into a 3D image by hand motion of a mobile device employing the method. In this embodiment, the application takes advantage of the mobile device's accelerometer. When the application detects a change in the sensor readings made by the accelerometer, a task may be activated by the application. In this example, the task is the conversion of the 2D image to a 3D image and its display, or display of an already generated 3D image. Of course, it should be understood that any task or function associated with the application can be tied to the accelerometer in a similar fashion.

The room parameters are the definition of the actual room size defining at least length, width and height of the 3D room. The room size may be calibrated based on at least one known item shown in the digital image. The computer system compares a number of items stored in a memory for defining the actual size of the item, which may be used for performing the calibration of room parameters. Selecting the data storage for the inner surfaces of the room may involve selection and definition of the type of floor, the type of wall and the type of ceiling. Selection of the inner surface of the room may be based on manual input of data. Selection of furniture in the room may be based on manual input of data. Manual input data may be obtained by a selection between groups that represent different styles of furniture. The computer system may perform a selection between different groups of furniture and the actual furniture based on input of a maximum cost to the computer system.

In an embodiment, the method for creating a visual representation of a redecorated room includes: providing a first image of said room, wherein the image may be obtained from a digital camera associated with a mobile device having wireless communications capability, providing an identification of a desired decoration type for said room, wherein said identification may be selected from the group comprising a living room, a dining room, a bedroom, a bathroom, and a kitchen, providing a menu of user preferences made available on the mobile device, wherein said preferences may be selected from a group comprising: manufacturers of objects suitable for the selected room identification and available styles of décor, providing a server operating a program configured to receive a pre-determined number of 2D Architectural images, receive said first image from said mobile device, said identification of room type, and user preferences, wherein the program may be further configured to: determine the shape and type of room, wherein said shape and type of room may be used to select a layout model; select a layout model from a catalog of room types, based on matching relevant parameters, select a visual representation of a showroom of objects that match the room type and décor style selected by the user, publish said visual representation to the mobile device for viewing by the user, and provide a set of URL's the user can select to view an object of interest from said showroom of object. A pre-determined number of 2D Architectural images may be added to the system before receiving any user photos. These may be rendered images of each showroom that will be used, only rendered without any furniture. The empty room images may be used to create Layout Models just as for photos received from users.

In an embodiment, the method for enabling a user to view at least one modified visual representation of a room on a screen of a mobile device, includes wirelessly transmitting a first digital image of said room as captured by the user on a mobile device to a remote server, receiving a set of preferences selected by the user comprising type of room and style of décor desired for the modified visual representation, wherein the server may be configured to: provide a set of layout models for room types, determine a best match for layout model and room as captured in said first digital image, send a visual representation of said best matched layout model back to mobile device for viewing by the customer, send a set of URL's for objects of interest according to said user preference selections for viewing by the customer, and displaying the user's choice of object of interest in said layout model for viewing on said mobile device.

In an embodiment, an application for use on a mobile device may include a computer program configured for storage in memory of a mobile device configured to: present at least one preference to a user of the mobile device regarding the desired configuration of a room, accept a preference choice form the user, send a photo of a room to a server via a wireless transmission, send said preference choice to a server, receive and display an image of said room with a list of options for choices of decoration, select at least one optional decoration choice and send said choice to server, receive a modified image with said decoration choice shown in said image, and present at least one URL for access to the manufacturer website of said decoration choice.

In an embodiment, a system for creating a visual representation of a redecorated room includes a server having a processor, memory, and a connection to wireless services and the internet, a computer readable storage medium having encoded thereon a set of instructions executable by the processor to perform a series of operations, wherein the set of instructions includes: instructions for assessing the type of room represented by the digital image, instructions for receiving at least one user preference for redecorating a room, instructions for selecting the best match between the digital image and at least one of a model layout stored in memory, instructions for selecting a series of objects suitable for use in a decorating palette according to at least one submitted user preference, wherein each object may be accompanied by a URL for the manufacturer of said object, instructions for publishing the best match layout model and the series of objects in the decorating palette and said URL in a format viewable on a mobile device, and instructions for modifying the location of said object in said model layout.

Referring to FIG. 1 a system diagram is displayed 100. The system diagram 100 may include the user's view of a room as captured by a digital camera 102, digital camera 104 offering the ability to record and store digital images, wireless link 108 allowing the digital camera 104 to communicate with the communications network 110, communications network 110 offering the ability to place the other system elements in data communication with each other, such that they can be distributed geographically, including locating host processing elements on servers connected to the Internet, or as services hosted in a cloud configuration, redecorator server 112 configured to offer the ability to accept digital images from the communications network 110 and analyze digital images using specialized object recognition algorithms in software, and transfer the processed digital image through the communications network 110, and manufacturer websites 114 that contain URL's and sample furnishing/object information, such that they can be distributed through the communications network 110 to the redecorator server 112 to be applied to the modified image.

Figure 2:
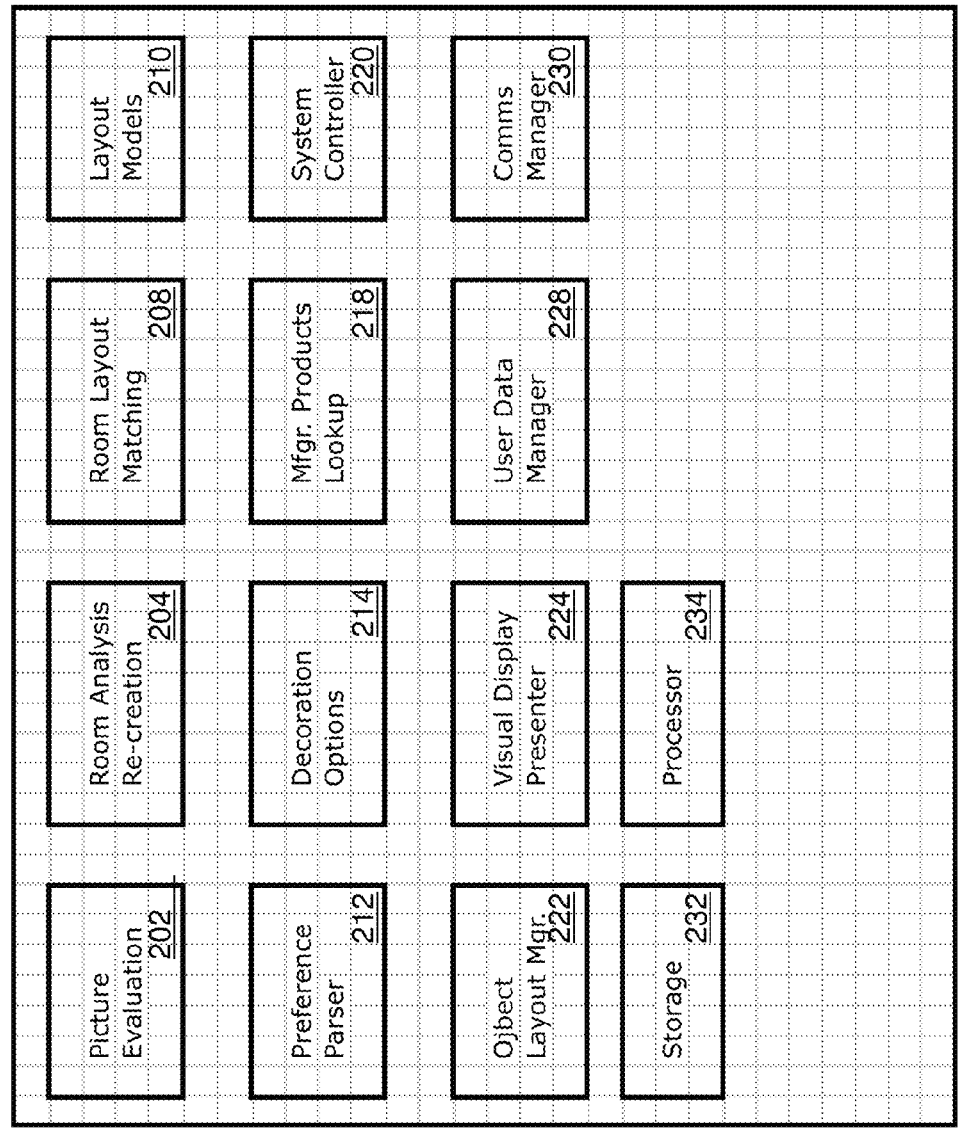
FIG. 2 illustrates the components of an operating system comprising a processor and various program modules.

Referring to FIG. 2 a block diagram of the redecorator server 112 is displayed 200. The various modules include: picture evaluation 202 allows for assessing the type of room represented by the digital image, room analysis re-creation 204 offering the ability to re-create a visual representation of room from the picture evaluation 202, room layout matching 208 allows for received digital images to be matched with best fitting Architectural Shape images through matching the layout models 210 from the digital image with best fitting layout model 210 from the collection of Architectural Shapes, layout models 210 are representations of the user's view of a room as captured by a digital camera 102, sans extant furniture but now including new furniture, preference parser 212 allows for analyzing or separating preferences into more easily processed components, decoration options 214 include the various decorations that can be applied to a room, manufacturer products look up 218 allows specific manufacturer's to be selected by the user according to preference, system controller 220 offering the ability to manage, command, direct or regulate the behavior, function or actions of other devices or systems connected to the redecorator server 112, object layout manager 222 associated with the ability to place components in a graphical user interface and or/implementing a policy for deciding how the components are positioned and sized, visual display presented 224, user data manager 228 offering the ability to ensure that the items that users create, such as personal files and documents, are easily accessible and readily available, comms manager 230 offering the ability to communicate between the various modules contained within the redecorator server 112 and the communications network 110, storage 232 allows data to be stored on the redecorator server 112, and processor 234 offering the capability of executing a set of instructions to perform a series of operations.

Referring to FIG. 3 a flow chart at server is described 300. At step 310 a digital image is received. At step 320, user preferences are received. At step 330 a digital image is analyzed to determine room 'essence' [eigenvalues]. At step 340 a comparison to stored layout models is performed. At step 350 a best layout model is determined. At step 360 a layout model with sample objects based on user preferences is populated. At step 370 a layout model digital image to user, along with list and URLs of manufacturers of suitable furnishing objects, and showrooms are published (transmitted).

Referring to FIG. 4 an application flow chart at mobile devices is described 400. At step 410 a digital image is taken/made or otherwise received. At step 420 user preferences are selected. At step 430, image and preferences re sent to the server. At step 440 a modified digital image is received. At step 450 a list of sample furnishings/objects with manufacturer URLs is received. At step 460 sample objects based in modified image is populated. At step 470 location orientation of sample objects is adjusted.

Figure 5:
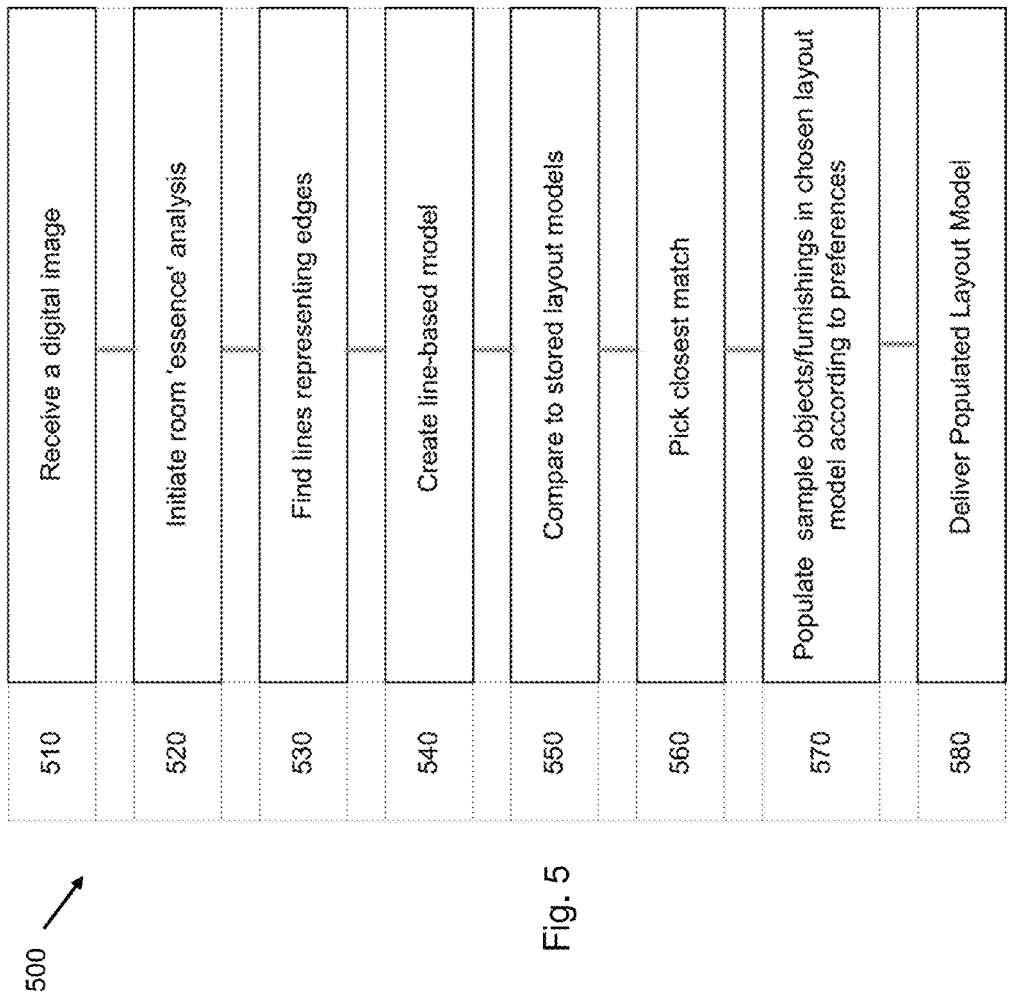
FIG. 5 illustrates a flow chart for performing a function at the server.

Referring to FIG. 5 an image analysis flow chart is described 500. At step 510 a digital image is received. At step 520 a room 'essence' analysis is initiated. At step 530 lines representing edges are found. At step 540 a line-based model is created. At step 550 stored layout models are compared. At step 550 stored layout models are compared. At step 560 a closest match is picked. At step 570 sample objects/furnishings in chosen layout model according to preferences is populated. At step 580 a populated layout model is delivered.

Figure 6:
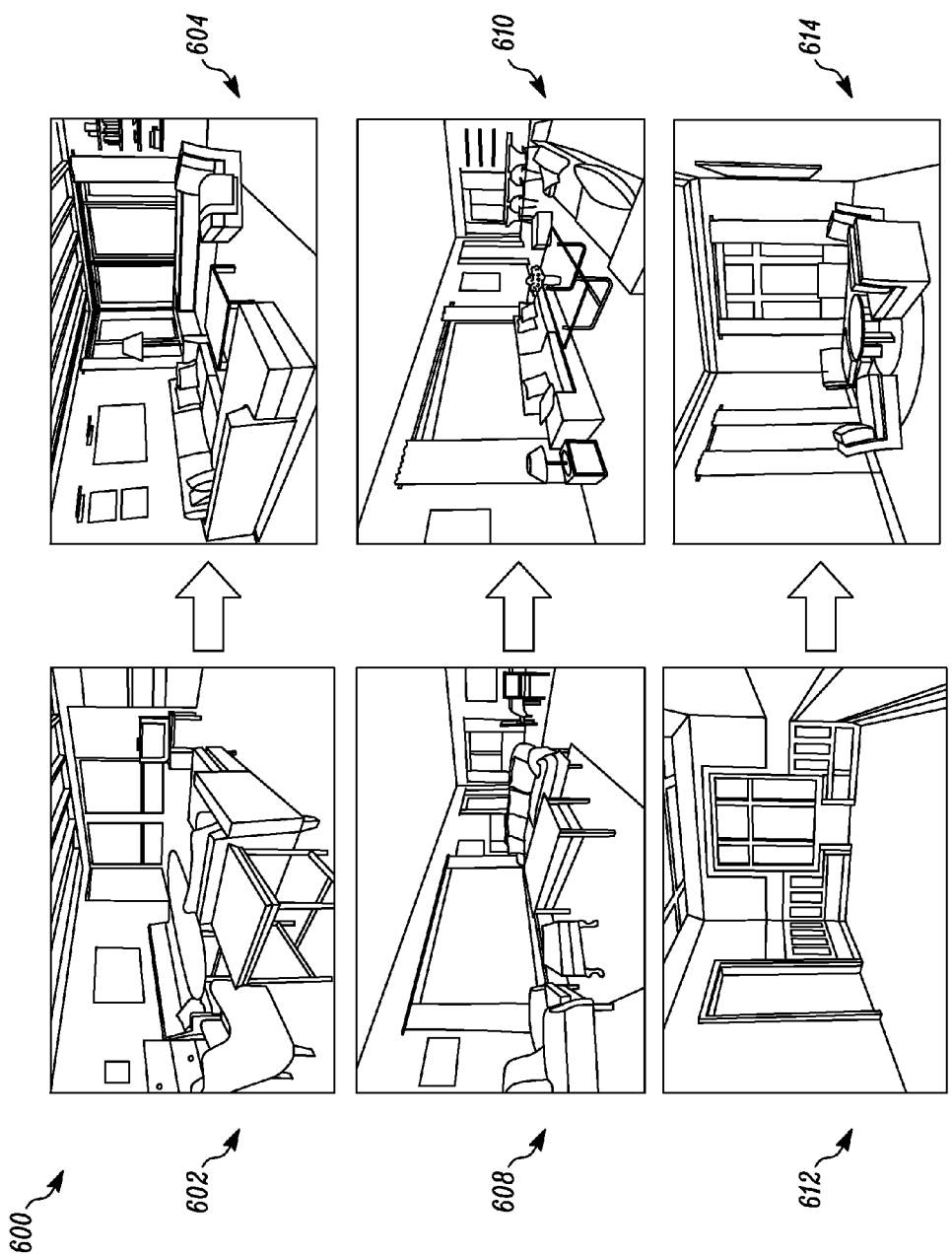
FIG. 6 illustrates three examples of how a photograph of a room is processed to show a redecoration.

Referring to FIG. 6 an example of photo processing for a redecoration 600. Before images are shown in 602, 608, and 612 with corresponding after images in 604, 610, and 614 respectively.

Figure 7A:
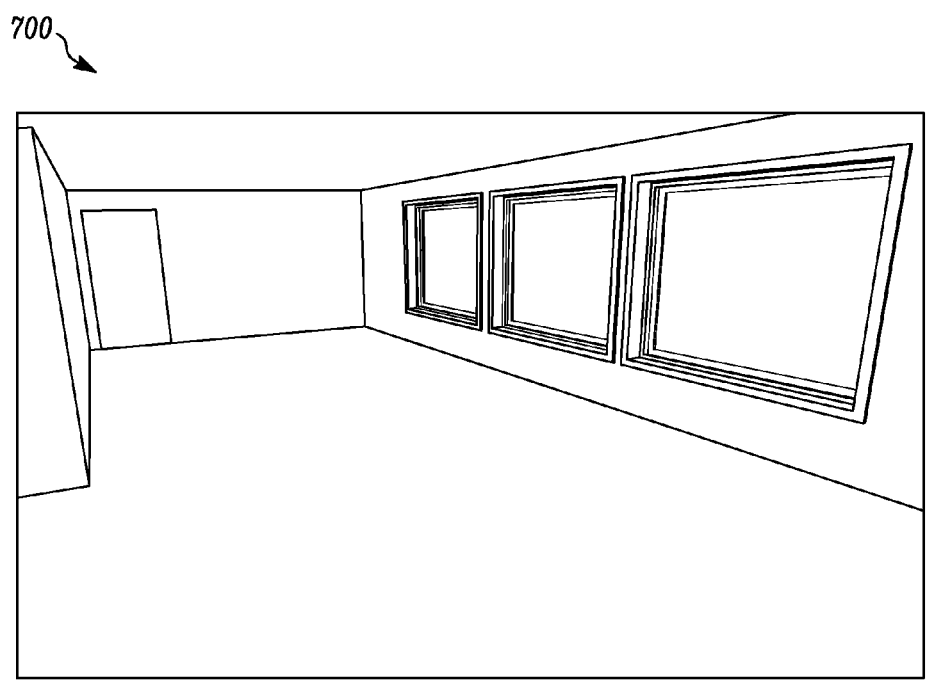
FIGS. 7A, B, and C illustrate another example of how a photograph of a sample room looks after all decorations are removed, and then decorated in two different styles.
Figure 7B:
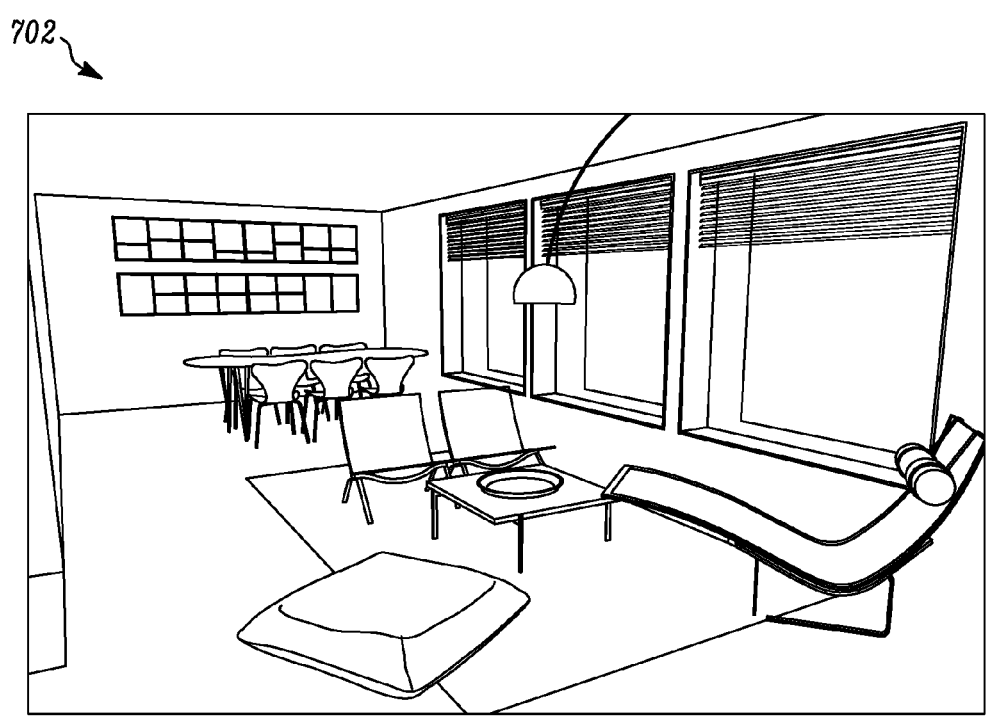
Figure 7C:
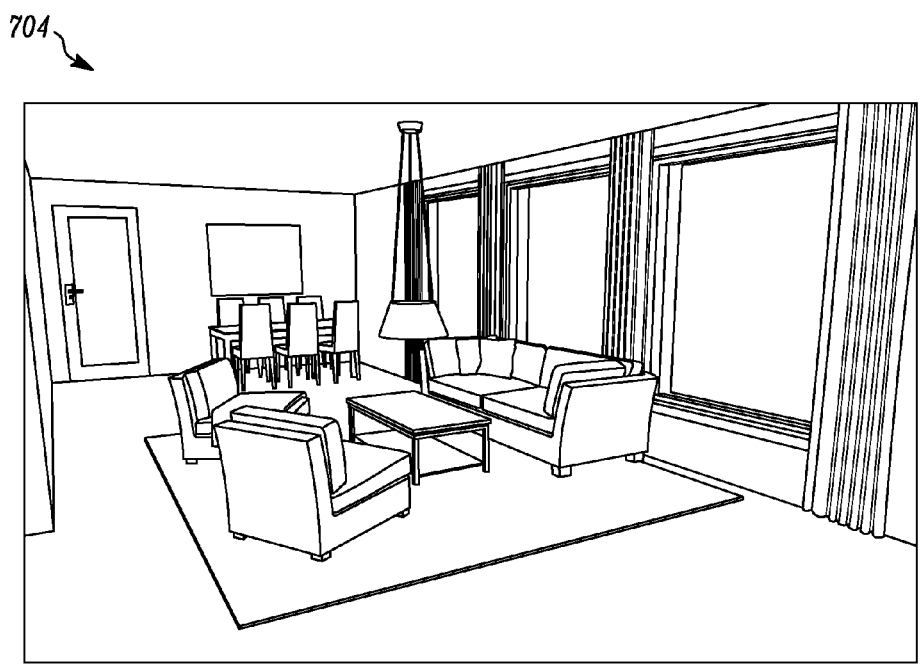

Referring to FIG. 7A a sample room where previous furniture/decorations are cleared from image is displayed 700. Referring to FIG. 7B an image of the sample room as redecorated in a first version is displayed 702. Referring to FIG. 7C an image of the sample room redecorated in a second version is displayed 704.

Referring to FIG. 8 a position frame lock flow chart is described 800. At step 802 the position frame lock starts. At step 804 the position/frame lock application is activated. At step 808 a room style for redecoration is chosen. At step 810 the "Position Frame Lock" mode is chosen. At step 812 a picture of the room is taken. At step 814 a user scrolls through room archetypes from a library and chooses the best match. At step 818 selected room archetype is further processed by redecoration engine to suit selected room style. At step 820 the position frame lock application ends.

The methods and systems described herein may be deployed in part or in whole through a machine that executes computer software, program codes, and/or instructions on a processor. The processor may be part of a server, cloud server, client, network infrastructure, mobile computing platform, stationary computing platform, or other computing platform. A processor may be any kind of computational or processing device capable of executing program instructions, codes, binary instructions and the like. The processor may be or include a signal processor, digital processor, embedded processor, microprocessor or any variant such as a co-processor (math co-processor, graphic co-processor, communication co-processor and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more thread. The thread may spawn other threads that may have assigned priorities associated with them; the processor may execute these threads based on priority or any other order based on instructions provided in the program code. The processor may include memory that stores methods, codes, instructions and programs as described herein and elsewhere. The processor may access a storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache and the like.

A processor may include one or more cores that may enhance speed and performance of a multiprocessor. In embodiments, the process may be a dual core processor, quad core processors, other chip-level multiprocessor and the like that combine two or more independent cores (called a die).

The methods and systems described herein may be deployed in part or in whole through a machine that executes computer software on a server, client, firewall, gateway, hub, router, or other such computer and/or networking hardware. The software program may be associated with a server that may include a file server, print server, domain server, internet server, intranet server and other variants such as secondary server, host server, distributed server and the like. The server may include one or more of memories, processors, computer readable media, storage media, ports (physical and virtual), communication devices, and interfaces capable of accessing other servers, clients, machines, and devices through a wired or a wireless medium, and the like. The methods, programs or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers, social networks, and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the server through an interface may include at least one storage medium capable of storing methods, programs, code and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client and other variants such as secondary client, host client, distributed client and the like. The client may include one or more of memories, processors, computer readable media, storage media, ports (physical and virtual), communication devices, and interfaces capable of accessing other clients, servers, machines, and devices through a wired or a wireless medium, and the like. The methods, programs or codes as described herein and elsewhere, may be executed by the client. In addition, other devices required for execution of methods as described in this application may be considered as a part of the infrastructure associated with the client.

The client may provide an interface to other devices including, without limitation, servers, cloud servers, other clients, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The methods and systems described herein may be deployed in part or in whole through network infrastructures. The network infrastructure may include elements such as computing devices, servers, cloud servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements.

The methods, program codes, and instructions described herein and elsewhere may be implemented on a cellular network having multiple cells. The cellular network may either be frequency division multiple access (FDMA) network or code division multiple access (CDMA) network. The cellular network may include mobile devices, cell sites, base stations, repeaters, antennas, towers, and the like. The cell network may be a GSM, GPRS, 3G, EVDO, mesh, or other networks types.

The methods, programs codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer-to-peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g. USB sticks or keys), floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods and systems described herein may transform physical and/or or intangible items from one state to another. The methods and systems described herein may also transform data representing physical and/or intangible items from one state to another.

The elements described and depicted herein, including in flow charts and block diagrams throughout the figures, imply logical boundaries between the elements. However, according to software or hardware engineering practices, the depicted elements and the functions thereof may be implemented on machines through computer executable media having a processor capable of executing program instructions stored thereon as a monolithic software structure, as standalone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipments, servers, routers and the like. Furthermore, the elements depicted in the flow chart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps thereof, may be realized in hardware, software or any combination of hardware and software suitable for a particular application. The hardware may include a general purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions.

Thus, in one aspect, each method described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

While the invention has been disclosed in connection with the preferred embodiments shown and described in detail, various modifications and improvements thereon will become readily apparent to those skilled in the art. Accordingly, the spirit and scope of the present disclosure is not to be limited by the foregoing examples, but is to be understood in the broadest sense allowable by law. It will be appreciated that one skilled in the art can easily extend these embodiments to a wide variety of tasking instructions and scenarios.

All documents referenced herein are hereby incorporated by reference.

What is claimed is:

1. A method for real-time redesign of at least one room in a structure, comprising:
   receiving at least one digital image of the at least one room from a mobile device;
   performing an analysis of the at least one digital image, comprising:
   defining room parameters based on at least one of walls, ceiling, windows, floor, and doors, wherein defining room parameters comprises extracting one or more room eigenvalues from the at least one digital image;
   performing a room size calibration;
   defining a representative room based on the analysis and the calibration; and
   comparing the representative room to a collection of stored room types to identify a best match room type;
   generating a 3D model of the best match room type;
   populating the 3D model with at least one decoration; and
   generating an image of the populated 3D model.

2. The method of claim 1, wherein the step of populating with at least one decoration involves selecting at least one type of furniture for the best match room from a data storage.

3. The method of claim 1, wherein the step of populating with at least one decoration involves selecting at least one type of lighting for the best match room from a data storage.

4. The method of claim 1, wherein the image of the populated 3D model is generated from substantially the same point of view as the at least one digital image.

5. The method of claim 1, wherein any original interior decoration in the at least one digital image is rendered so as to provide a phantom-look room.

6. The method of claim 1, further comprising, using a user preference to select the decoration.

7. The method of claim 6, wherein the user preference relates to at least one of a room type, a style of décor, a lighting type, an inner surface type, a floor type, a furniture type, a window type, a color, a furnishing, a texture, and a manufacturer.

8. The method of claim 1, wherein the one or more eigenvalues of the at least one room is selected from the group consisting of;
   a number of windows of a room; a number of doorways of a room; a number of doors of a room; a dimension of a window of a room; a dimension of a door in a room; a length of a wall of a room; a width of a room; and a height of a wall of a room.

9. The method of claim 1, wherein the room size is calibrated based on at least one known item shown in the at least one digital image.

10. A method for creating a visual representation of a room, comprising:
    receiving a first image of the room, wherein the first image is obtained from a digital camera associated with a mobile device having wireless communications capability;
    providing a menu of user preferences made available on the mobile device; and
    providing a server operating a computer readable medium storing a computer program configured to
    access a database of reference rooms,
    receive said first image from the mobile device, and
    receive one or more user preferences;
    wherein the computer program is further configured to:
    a: determine a shape and type of the room, wherein said shape and type of room is used to select a layout model;
    b: select a reference layout model from the database of reference rooms, based on a match with the layout model, the match determined by one or more eigenvalues extracted from the first image of the room and one or more eigenvalues of a room from the layout model;
    c: generate a visual representation of a redecorated room based on at least one user preference selected by the user from the menu of user preferences; and
    d: publish the visual representation to the mobile device for viewing by the user.

11. The method of claim 10, further comprising, providing a set of URL's the user can select to view an object of interest from the visual representation.

12. The method of claim 10, further comprising generating an additional image from a different location in a room and generating an additional one or more eigenvalues from the additional image.

13. An application for use on a mobile device, comprising:
    a computer program configured for storage in a non transmitory memory of a mobile device configured to:
    present at least one preference to a user of the mobile device regarding a desired configuration of a room;
    send an image of the room to a server via a wireless transmission;

send a user-selected preference choice to the server;

receive and display an image of said room with a list of options for choices of decoration, the list of choices determined by a match between one or more eigenvalues of the desired configuration of the room and one or more eigenvalues for a best room match with the user-selected preference choice;

select at least one optional decoration choice and send said choice to server; and receive a modified image with said decoration choice shown in said image.

14. The application of claim 13, further comprising, configuring the computer program to present at least one URL for access to the manufacturer website of said choice of decoration.

15. A system for creating a visual representation of a redecorated room, comprising:

a server having a processor, memory, and a connection to wireless services and the internet;

a computer readable non-transitory storage medium having encoded thereon a set of instructions executable by the processor to perform a series of operations, comprising:

receiving at least one digital image of the room from a mobile device;

performing an analysis of the at least one digital image, comprising:

defining room parameters based on at least one of the walls, ceiling, windows, floor, and doors, wherein defining room parameters comprises extracting one or more room eigenvalues from the at least one digital image;

performing a room size calibration;

defining a representative room based on the analysis and the calibration; and comparing the representative room to a collection of stored room types to identify a best match room type;

generating a 3D model of the best match room type;

populating the 3D model with at least one decoration; and generating an image of the populated 3D model.

16. The system of claim 15, further comprising generating an additional digital image from a different location in the room and generating an additional one or more eigenvalues from the additional digital image.

17. The system of claim 15, further comprising, calculating a degree of match between stored room eigenvalues for a reference room and the extracted eigenvalues to identify the best match room type.

18. The system of claim 15, wherein the room eigenvalue is at least one of the location, direction and length of edges, corners, windows, doors, openings, walls, architectural shapes, and surfaces in the room.

19. The system of claim 15, wherein the decoration involves selecting at least one of a type of furniture and a type of lighting for the best match room from a data storage.

20. The system of claim 15, wherein any original interior decoration in the at least one digital image is rendered so as to provide a phantom-look room.

* * * * *